United States Patent
Bogdan et al.

(10) Patent No.: US 7,570,439 B2
(45) Date of Patent: Aug. 4, 2009

(54) OPTICAL MODULE AND OPTICAL SYSTEM

(75) Inventors: Danut Bogdan, Timisoara (RO); Josef Dirmeyer, Bodenwöhr (DE); Henryk Frenzel, Regensburg (DE); Harald Schmidt, Regensburg (DE)

(73) Assignee: Siemens Aktiengesellschaft, Munich (DE)

( * ) Notice: Subject to any disclaimer, the term of this patent is extended or adjusted under 35 U.S.C. 154(b) by 238 days.

(21) Appl. No.: 10/573,540

(22) PCT Filed: Sep. 22, 2004

(86) PCT No.: PCT/EP2004/052266

§ 371 (c)(1),
(2), (4) Date: Apr. 24, 2006

(87) PCT Pub. No.: WO2005/031879

PCT Pub. Date: Apr. 7, 2005

(65) Prior Publication Data
US 2006/0239632 A1    Oct. 26, 2006

(30) Foreign Application Priority Data
Sep. 26, 2003    (DE) ................................ 103 44 771

(51) Int. Cl.
*G02B 7/02* (2006.01)
(52) U.S. Cl. .................. 359/811; 359/812; 359/813
(58) Field of Classification Search ................ 359/811, 359/819, 821, 822, 812, 813, 817, 818
See application file for complete search history.

(56) References Cited

U.S. PATENT DOCUMENTS

| 4,024,397 | A |   | 5/1977 | Weiner |
| 5,353,070 | A | * | 10/1994 | Mitani et al. ................ 348/781 |
| 5,912,504 | A |   | 6/1999 | Yoshizawa et al. |
| 6,483,652 | B2 | * | 11/2002 | Nakamura ................... 359/819 |
| 6,559,439 | B1 | * | 5/2003 | Tsuchida et al. ............ 250/239 |
| 6,627,872 | B1 |   | 9/2003 | Fukamura et al. |
| 6,819,508 | B2 | * | 11/2004 | Chiang ....................... 359/796 |
| 6,822,041 | B2 | * | 11/2004 | Schottland et al. .......... 524/588 |
| 6,911,648 | B2 | * | 6/2005 | Wu et al. ..................... 250/239 |
| 2002/0006687 | A1 |   | 1/2002 | Lam |

FOREIGN PATENT DOCUMENTS

| DE | 199 58 229 A1 | 6/2000 |
| EP | 0 585 186 A2 | 8/1993 |
| JP | 2003 101002 | 4/2003 |
| WO | WO 00/38249 | 6/2000 |

* cited by examiner

*Primary Examiner*—Timothy J Thompson
(74) *Attorney, Agent, or Firm*—Laurence A. Greenberg; Werner H. Stemer; Ralph E. Locher

(57) ABSTRACT

An optical module has a circuit carrier, a housed semiconductor element disposed on the circuit carrier, and a lens unit for projecting electromagnetic radiation onto the semiconductor element. The lens unit preferably includes a lens assembly with, say, three lenses and a diaphragm. The lenses, optionally together with the diaphragm, are aligned in a well-defined manner due to their geometric design so that no additional optical adjustment is necessary. The lenses are held in a type of lens holder that is an integral component of the housing of the semiconductor element.

21 Claims, 1 Drawing Sheet

OPTICAL MODULE AND OPTICAL SYSTEM

BACKGROUND OF THE INVENTION

Field of the Invention

The invention relates to an optical module comprising a circuit carrier, a cased semiconductor element placed on the circuit carrier and a lens unit for projecting electromagnetic radiation onto the semiconductor element.

The invention also relates to an optical system with an optical module formed in the same way.

Generic optical modules and systems are particularly applicable to automotive engineering.

Such applications can make use of electromagnetic radiation in different frequency ranges, so that in addition to visible light, which is typically used by applications dealing with the space surrounding a motor vehicle, such as lane departure warning (LDW), blind spot detection (BSD) or rear view cameras, use is also made of the invisible infrared radiation which is preferred in applications within a motor vehicle, such as out of position detection (OOP) or, subject to additional external illumination, a night vision system.

Because of external influences such as temperature, humidity, contamination and vibration, stringent requirements are placed on applications relating to the interior or exterior of motor vehicles. The typical service life of systems in vehicles is between 10 and 15 years, during which time only extremely low failure rates are tolerated; the components of an optical system of the type mentioned at the outset must therefore also exhibit only very slow deterioration.

In many cases the space available for installing optical modules or optical systems is very limited, and represents further difficulties for the production of optical systems. Using conventional means it is therefore extremely difficult to construct a reliable, hermetically sealed unit from a camera chip (CCD or CMOS sensor) and an optical system.

In order to obtain adequate image definition for a camera system consisting of an image sensor (currently CCD or CMOS) and a lens system, the geometry of the sensor and optics must be very precisely matched. The tolerance range for the distance between the camera chip and the optics in the Z axis is usually a few hundredths of a millimeter in order to obtain an optimally sharp image for a given depth of field range. This is a particular problem for those systems known as fixed focus, since during manufacture they are burdened with tolerances which are small at best. A misalignment between the camera chip and the optics along the X or Y axis can also result in making the optical system "squint", that is, the image is cut off at one edge (horizontally or vertically), because the offset means there are no more pixels available at this position and they should to be provided as a precaution.

A further problem is known as "tilt", in which the camera chip tilts about the X or Y axis; as a result the image has a blurred gradient in the horizontal or vertical direction. There can also be rotation about the Z axis between the camera chip and the optics.

Virtually all fixed focus camera systems that are commercially available at the present time require an additional matching step during manufacture; this involves setting the distance between the camera chip and the optics along the Z axis and then fixing it at that value. This may be done with the aid of a screw thread and a corresponding set screw or an adhesive joint. A matching step may also be needed for the X-Y misalignment or, if this is not done, a correspondingly larger sensor may be provided in order to satisfy the tolerances by means of an increased number of pixels. It is also known that rotation can be excluded or calibrated by means of software. Since otherwise sharp image information exists, the pixels need only be reallocated in a type of adjustment process. However, there may be simply no information at the edges or corners, because they have been cut off. In most systems, a purely mechanical reduction of the tilt and rotation between the chip and the optics can usually only be achieved by high-precision manufacturing and assembly or by component matching.

However, due to costs and quality assurance aspects, cameras for specific low cost applications such as automotive and industrial, digital cameras, mobile phones, toys etc., must be capable of being manufactured as far as possible without adjustment processes between the optics and the camera chip, that is, without setting the focus to the optical surface of the CMOS or CCD sensor. This runs basically counter to the requirements mentioned above.

One option for developing a focus-free system is to reduce the total number of possible tolerances and elements, so that the module or system is designed to operate without adjustment at least within defined ranges of distance and temperature. When for example the invention is used in the context of a vehicle occupant protection system, to which however the present invention is not restricted, clearly defined images should be guaranteed at distances of 15 cm to 130 cm, for instance, and at temperatures between −40° C. and +105° C. The fewer the elements in the tolerance chain, the more feasible this becomes. In housed semiconductor elements, the necessary soldered or adhesive joints or the like between the chip and the circuit carrier occupy a particularly large part of the tolerance chain.

When only one lens is used, steps are taken to avoid complicating the lens configuration in order not to produce additional optical tolerances. The actual lens holder, preferably made of plastic, can be connected to the lens assembly by different means, so that an exact optical alignment of the lens assembly and the semiconductor element can always be ensured relative to the lens holder or the lens assembly.

Even so, in systems having a fully conventional structure for the objective and camera chip, in which the camera chip or the semiconductor element is arranged on a suitable circuit carrier within a case, it is difficult to fully solve the above-mentioned problems at the same time as fulfilling the said quality requirements. As it happens, for cased semiconductor chips, special measures against parasitic light radiation or other environmental influences need only be taken from the front, since the chip housing provides adequate protection from the back for the silicon, which is transparent to infrared radiation. The objective itself, however, must be adjusted to the camera chip and possess defined focusing. Nowadays this process uses a tolerance-laden locking device such as a screw fitting, an adhesive or the like, which fixes the objective relative to the camera chip and circuit carrier.

SUMMARY OF THE INVENTION

The object of the invention is to provide an optical module and an optical system comprising a cased semiconductor element arranged on a circuit carrier, with the aim of reducing the possible tolerance chain to an absolute minimum, so that by means of simple and cost-effective assembly it is possible to produce reliable optical quality which does not need costly adjustment and in particular focusing, and will last for the service life of the module or system. It is further intended as far as possible to omit measures against parasitic light radiation or other environmental influences from the front.

This object is achieved by means of the features which will emerge from the main claims. Advantageous embodiments of the invention, which can be used individually or in combination with one another, are specified in the sub-claims.

The invention is based on a generic optical module in which the lens unit for projecting electromagnetic radiation onto the semiconductor element comprises a type of lens holder that is an integral component of the case (housing) of the semiconductor element. This can be produced easily by using injection-molded plastic housings, since in this event, in addition to the actual shape of the case, the edge area in particular can take virtually any form, and in particular can include an area for supporting a lens assembly with a defined focus in relation to the chip. By this means a cased chip can initially be manufactured as a standard component in the form of a surface mounted device (SMD) already provided with a mounting to receive the optics which will be fitted later.

The tolerance range available for focusing is then essentially dependent only on the lens assembly. The proposed solution has the further advantage that the integrated design of the lens holder and the chip case eliminates the incidence of parasitic light from the side.

In a preferred embodiment of the invention the area supporting the lenses is formed in one piece with the housing, for example out of a thermosetting plastic material.

Alternatively, the area supporting the lenses is preferably formed on the housing, for instance in a two-component injection process. This advantageously enables the optional use of different plastics. For example it has been found useful to form the area supporting the lenses from a thermoplastic material and the housing for the semiconductor housing from a thermosetting plastic material.

The major difference between heat-formable thermoplastic and thermosetting plastic, which is not heat-formable, is based on the behavior of the plastic concerned during forming. When a thermoplastic is heated and pressed into a mold, no chemical reaction of any kind takes place. Once the plastic in the mold has cooled and hardened, it could be reheated and made into another shape without any noticeable change occurring in the characteristics of the plastic. This property can be put to advantageous use in the case of the connection configurations described in a later section and consisting of at least one lens together with supporting area.

Thermosetting plastics on the other hand undergo chemical changes while being given their final shape. They react with a condensation polymerization and bond together in the form of a three-dimensional lattice. This hardening by means of a structural change in the molecule is particularly advantageous with respect to fixing the leadframe of a semiconductor element and is not reversible: Once a thermosetting plastic has been formed, its shape cannot be changed. Thermosetting plastics include phenolic resins, melamines and urea resins.

A lens assembly is preferably provided with a plurality of lenses and optionally at least one diaphragm in the form of a package. The optical quality can be improved by an objective having a plurality of lenses, which is also possible in the context of the present invention, particularly since it is then possible to operate using few tolerances. In this connection it is also particularly advantageous for the lenses and where appropriate the diaphragm to be in direct contact with one another. This approach virtually excludes fluctuations of the lens assembly in the Z direction, that is, in the same direction as the sequence of lenses. The tolerances are then dependent only on the lens assembly itself. Similarly it is particularly useful for the relative positions of the lenses to be matched to one another by the geometry of the actual lenses and, as appropriate, diaphragms. The arrangement of the lenses can also be defined by the lenses themselves in the X-Y direction, in this case by appropriately designing the bearing surfaces of the lenses or diaphragms.

It is particularly useful for exactly one of the lenses or diaphragms to be in direct contact with the lens holder. Since the lenses determine their positions relative to one another, it is sufficient to attach just one lens or diaphragm to the lens holder. By this means the whole lens assembly is aligned relative to the semiconductor element, so that the advantageous optical quality can finally be guaranteed. In this connection it is particularly advantageous if the exactly one lens is joined to the lens holder in a watertight and dustproof manner. Advantageously the front lens is chosen as the lens which works in conjunction with the lens holder to provide a seal. The methods for attaching the exactly one lens to the lens holder can include ultrasound, laser soldering and/or adhesives; alternatively or cumulatively, screws and/or mastic or the like may be used in appropriate cases.

Similarly it is possible to use a means of latching so that the lens assembly can be snapped into the area supporting the lenses. Moreover this makes it possible to ensure exact positioning. It must be further emphasized that by this means it is easier to ensure that the lenses are kept separate from the other components, in particular the expensive semiconductor element. The sealing effect is provided in conjunction with a snap assembly in a particularly advantageous way, in that the lenses have a hard and a soft component, the soft component being arranged as a seal in the area of the lenses. The soft component also supports the general requirement that when the assembly is snapped in, care must be taken not to introduce stress into the lenses; stresses would always have a negative effect on the optical properties.

As an alternative to an adhesive or soldered joint, or to a snap assembly, a specially designed retaining element (molded ring) can be provided for attaching the lens assembly in the area supporting the lenses. The retaining element preferably has a hard component and a component of which at least some section is permanently elastic. A permanently elastic component which is preferably designed as a ring can also seal the lens assembly against humidity and contamination, in addition to its intrinsic function of compensating for any mechanically and/or thermally induced stresses. The permanently elastic component is preferably formed on the area supporting the lenses. In the area of the harder component the retaining element is arranged on the area supporting the lenses by means of an attachment method which can be automated, such as ultrasound, laser soldering, adhesive, riveting, forming or some other equally effective automated method. Screwed or snap joints are also possible. The hard component of the retaining ring preferably contains a thermoplastic material. A permanently elastic component which preferably contains thermoplastic elastomer (TPE), silicon or the like has proved to be useful in this respect. For the purpose of providing a component which can be uniformly and easily handled, it is preferable for the permanently elastic component to be formed on the hard component, or vice versa, in a two-component injection process.

It can further be particularly advantageous to prevent unwanted optical effects, in particular those due to lateral light incidence, by means of a black and/or dull finish or by the use of total reflection, achieved by applying the appropriate pigments to the area supporting the lenses. These are examples of appropriate measures.

The invention further consists of an optical system with an optical module of the type mentioned above. The optical module then shows to its best advantage in the context of an overall system.

The invention is based on the recognition that by designing a chip housing with an integrated area supporting the lenses, a chip can be fitted by means of SMD technology prior to assembling said lenses and a camera module can be incorporated when the lenses are assembled, thereby making it unnecessary to set the focus mechanically. Thus manufacture of the module can be fully automated, with the advantage that manufacturing and assembly costs are lower for large quantities. Furthermore the optical module can be produced without moving parts such as screw threads or fixing screws, resulting in greater reliability. Since the configuration has few tolerances in both the X axis and the Y axis, the chip need not be unnecessarily large in area, which reduces the cost of the camera chip. The design of such a module can be relatively compact, with the advantage that the camera module can even be used in applications where the available space is limited. Lastly, the integrated design provides the additional advantage of protection against parasitic light radiation.

The invention can be put to good use in the production of video systems, possibly in combination with radar systems, ultrasound systems and the like in the automotive sector.

The invention is now described by way of example with regard to the accompanying drawings with reference to preferred exemplary embodiments, in which;

DESCRIPTION OF THE PREFERRED EMBODIMENTS

In the description which follows of preferred embodiments of the present invention the same reference numbers designate the same or comparable components.

Figure 1:
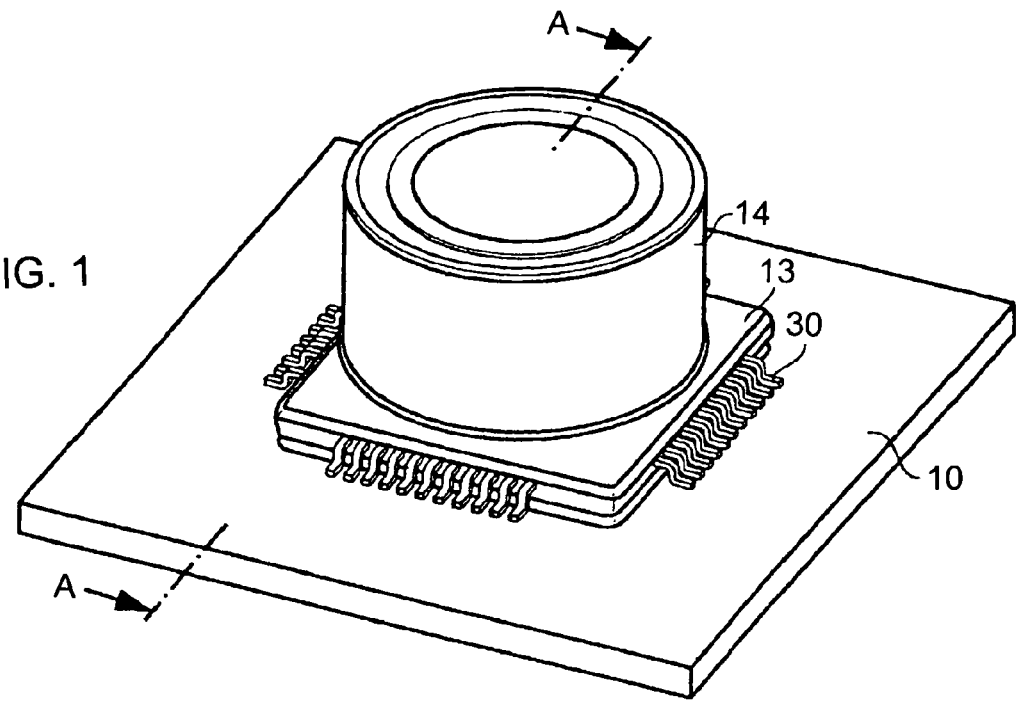
FIG. 1 shows a view of the optical module to which the invention relates, shown in perspective.

FIG. 1 shows in perspective a view of an optical module to which the invention relates, comprising: a circuit carrier 10; a semiconductor element 12 housed using SMD technology and arranged on the circuit carrier 10, and a lens unit 14; 16, 18, 20; 21 for projecting electromagnetic radiation onto the semiconductor element 12.

Figure 2:
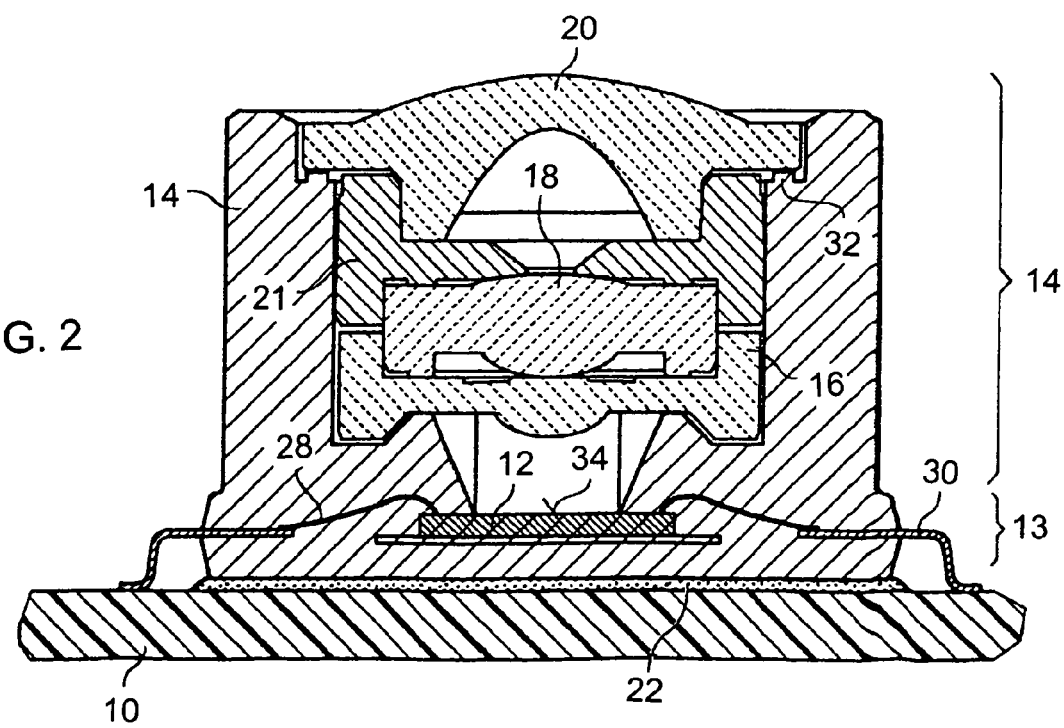
FIG. 2 shows the module according to FIG. 1 shown as a sectional view along the line A-A.

FIG. 2 shows the module according to FIG. 1 as a sectional view along the line A-A.

According to the invention the lens unit comprises a lens holder 14 that is an integral component of the housing 13 of the semiconductor element 12. In the present exemplary embodiment the area 14 supporting the lenses is preferably formed in one piece with the housing 13 from for example a dual-plastic material that is typically used for chip housings and has proved particularly advantageous for an adhesive, screwed and/or snap fixing between a lens 20 held in the area 14 and said area 14. An alternative possibility is a formed connection between the housing 13 and the area 14 supporting the lens assembly 16, 18, 20; 21.

The semiconductor element 12 can be designed according to present-day technology, for instance as CMOS or CCD. The housed (encased) semiconductor element 12 and the circuit carrier 10 are connected by means of elements known as leadframes 30, which are in contact via gold wires 28 with bonding points (not shown) formed on the semiconductor chip 12. To protect the solder points between leadframes 30 and circuit carriers 10 from breaks in contact, for example due to mechanical stresses, the case 13 of the chip 12 is preferably also joined to the circuit carrier 10 by adhesive. An adhesive for this purpose could be that used for SMD applications or similar.

The circuit carrier 10 itself is preferably in the form of a rigid PCB. The said 10 can be electrically connected via ribbon cable to further rigid circuit boards (not shown). It is advantageously possible to do without a separate electrical connection of this type by using a flexible printed circuit board as the circuit carrier 10 which at the same time provides the electrical connections (not shown), possibly by means of soldering. Due to their angle and position etc., such rigid-flexible systems, as they are known, are a particularly flexible solution for connecting the circuit carrier 10 or module to a control unit or circuit board (not shown).

Three lenses 16, 18, 20 and one diaphragm 21 are preferably used in the area 14 supporting the lenses, within the chip housing 13, for applications inside a motor vehicle interior. The lenses 16, 18, 20 and the diaphragm 21, are formed so that they occupy a defined position relative to one another in the area 14 supporting the lenses, within the chip housing 13. At least one of the lenses 16 is further designed to work in conjunction with the area 14 supporting the lenses, in such a way that the said 16 occupies a defined position relative to an electromagnetic radiation-sensitive surface 34 of the semiconductor element 12. Moreover at least one lens 20 is joined to the holder 14 in a watertight and dustproof manner, for example by a means of latching 32. All lenses 16, 18, 20 and where appropriate diaphragms 21 are thus aligned relative to the semiconductor element 12. Said alignment is unaffected by further measures, since the area 14 supporting the lenses 16, 18, 20; 21 is an integral part of the semiconductor housing 13.

Since the chip housing 13 is designed to have an integrated area 14 supporting the lenses 16; 18, 20; 21, the present invention can incorporate a camera module in which a chip 12, 13 can be fitted by means of SMD technology prior to assembling the lenses 16, 18, 20; 21, and when the lenses 16, 18, 20; 21 are being assembled any kind of mechanical focus setting can be dispensed with. Thus manufacture of the module can be fully automated, with the advantage that manufacturing and assembly costs are lower for large quantities. Furthermore the module can be produced without moving parts such as screw threads or fixing screws, resulting in greater reliability. Since the configuration 13; 14; 16, 18, 20; 21 has few tolerances in both the X axis and the Y axis, the chip area 34 need not be unnecessarily large, which reduces the cost of the camera chip 12. The design of such a module can be very compact, with the advantage that the camera module can even be used in applications with limited space available. The configuration further offers the possibility of designing a hermetically sealed module which is well protected against environmental influences such as humidity, dust and the like.

The features of the invention disclosed in this description, in the drawings and in the claims can be significant, both individually and in any combination, for the accomplishment of the invention. It is particularly suitable for applications relating to the interior and/or exterior of motor vehicles.

We claim:

1. An optical module, comprising:
   a circuit carrier;
   a semiconductor element and a housing encasing said semiconductor element disposed on said circuit carrier; and
   a lens unit disposed for projecting electromagnetic radiation onto said semiconductor element, said lens unit including a plurality of mutually aligned lenses and a lens support supporting said plurality of lenses, said lens support forming an integral component of said housing of said semiconductor element;

wherein said lens support is formed of a thermoplastic material and said housing is formed of a thermosetting material; and wherein only one lens of said plurality of lenses is in direct contact with said lens holder.

2. The optical module according to claim 1, wherein said lens support supporting said plurality of lenses is integrally formed in one piece with said housing.

3. The optical module according to claim 1, wherein said lens support supporting said plurality of lenses is formed on said housing of said semiconductor element.

4. The optical module according to claim 3, wherein said lens support is formed onto said housing in a two-component injection process.

5. The optical module according to claim 1, further comprising: at least one diaphragm, wherein said plurality of lenses are formed as a package, wherein said plurality of lenses and said diaphragm are in direct contact with one another, and relative positions of said plurality of lenses and said diaphragm relative to one another are defined by a geometry of said plurality of lenses and/or of said diaphragm.

6. The optical module according to claim 1, wherein said plurality of lenses are formed as a package, wherein said plurality of lenses are in direct contact with one another, and positions of said plurality of lenses relative to one another are defined by a geometry of said plurality of lenses.

7. The optical module according to claim 1, wherein said one lens is sealed watertight and dustproof with said lens holder.

8. The optical module according to claim 1, wherein said one lens is attached to said lens holder by at least one connection selected from ultrasound, laser soldering, and adhesives.

9. The optical module according to claim 1, wherein said plurality of lenses are snapped into said lens holder by latching engagement.

10. The optical module according to claim 9, wherein said one lens or an optional diaphragm is formed with a relatively hard component and a relatively soft component for forming a watertight and dustproof seal, and said soft component forms a seal in an area of said lenses.

11. The optical module according to claim 1, which comprises a retaining element attaching said plurality of lenses in said lens support.

12. The optical module according to claim 11, wherein said retaining element has a relatively hard component and a permanently elastic component formed on an area adjoining said one lens for forming a seal and compensating for stress, and wherein said hard component of said retaining element is joined to said lens holder.

13. The optical module according to claim 12, wherein said hard component is attached to said lens support by one or more attachment methods selected from the group consisting of ultrasound, laser soldering, adhesive or riveting processes, and a snap or screw connection.

14. The optical module according to claim 1, which comprises pigments applied to said lens support for setting a black and/or dull or totally reflective finish, for preventing unwanted optical effects.

15. The optical module according to claim 14, wherein said pigments are disposed to prevent unwanted optical effects due to a lateral incidence of light.

16. An optical module, comprising:
a circuit carrier;
a semiconductor element and a housing encasing said semiconductor element disposed on said circuit carrier; and
a lens unit disposed for projecting electromagnetic radiation onto said semiconductor element, said lens unit including a plurality of mutually aligned lenses for projecting the electromagnetic radiation onto said semiconductor element, said lens unit including a lens support supporting said plurality of lenses, said lens support forming an integral component of said housing of said semiconductor element;
said plurality of lenses snapped into said lens holder by latching engagement;
wherein at least one of said plurality of lenses is formed with a relatively hard component and a relatively soft component for forming a watertight and dustproof seal, and said soft component forms a seal in an area of said plurality of lenses.

17. The optical module according to claim 16, further comprising a diaphragm formed with a relatively hard component and a relatively soft component for forming a watertight and dustproof seal, said soft component forming a seal in an area of said plurality of lenses.

18. An optical module, comprising:
a circuit carrier;
a semiconductor element and a housing encasing said semiconductor element disposed on said circuit carrier;
a lens unit disposed for projecting electromagnetic radiation onto said semiconductor element, said lens unit including a plurality of mutually aligned lenses and a lens support supporting said plurality of lenses, said lens support forming an integral component of said housing of said semiconductor element; and
at least one diaphragm, wherein said plurality of lenses are formed as a package, wherein said plurality of lenses and said diaphragm are in direct contact with one another, and relative positions of said plurality of lenses and said diaphragm relative to one another are defined by a geometry of said plurality of lenses and/or of said diaphragm;
only one lens of said plurality of lenses being in direct contact with said lens holder;
said plurality of lenses including at least two separate lenses.

19. The optical module according to claim 18, wherein said one lens is sealed watertight and dustproof with said lens holder.

20. The optical module according to claim 19, wherein said one lens is formed with a relatively hard component and a relatively soft component for forming a watertight and dustproof seal, and said soft component forms a seal in an area of said plurality of lenses.

21. An optical module, comprising:
a circuit carrier;
a semiconductor element and a housing encasing said semiconductor element disposed on said circuit carrier; and
a lens unit disposed for projecting electromagnetic radiation onto said semiconductor element, said lens unit including a plurality of mutually aligned lenses and a lens support supporting said plurality of lenses, said lens support forming an integral component of said housing of said semiconductor element;
only one lens of said plurality of lenses being in direct contact with said lens holder;
said one lens being sealed watertight and dustproof with said lens holder.

* * * * *